United States Patent
German et al.

(10) Patent No.: US 6,168,474 B1
(45) Date of Patent: Jan. 2, 2001

(54) COMMUNICATIONS CONNECTOR HAVING CROSSTALK COMPENSATION

(75) Inventors: Michael Gregory German, Secaucus, NJ (US); Jeffrey Allen Hess, Fishers, IN (US); Julian Robert Pharney; William Tracy Spitz, both of Indianapolis, IN (US); Ted E. Steele, Lawrence, IN (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/326,370

(22) Filed: Jun. 4, 1999

(51) Int. Cl.$^7$ .................................................. H01R 17/18
(52) U.S. Cl. ............................................ 439/676; 439/620
(58) Field of Search ................................. 439/676, 620, 439/941, 76.1

(56) References Cited

U.S. PATENT DOCUMENTS

| | | | |
|---|---|---|---|
| 5,562,479 | 10/1996 | Pallas et al. | 439/404 |
| 5,639,261 | 6/1997 | Rutkowski et al. | 439/534 |
| 5,700,167 | 12/1997 | Pharney et al. | 439/676 |

*Primary Examiner*—Paula Bradley
*Assistant Examiner*—Phuongchi Nguyen

(57) ABSTRACT

The present invention relates to a communications connector comprising an internal circuit board having a plurality of circuit board layers that include a plurality of capacitive and inductive devices that counteract the crosstalk created by a first other connector mated to the communications connector. In addition, the communications connector comprises an internal fanout assembly mounted to the internal circuit board that has a plurality of conductors arranged so as to form a compensation area that counteracts crosstalk created by a second other connector mated to the communications connector. The circuit board can comprise at least one capacitive device provided on its outer surface that is manually reducible in size so as to adjust the amount of capacitance created therewith such that the amount of crosstalk compensation provided by the circuit board can be adjusted.

27 Claims, 9 Drawing Sheets

COMMUNICATIONS CONNECTOR HAVING CROSSTALK COMPENSATION

FIELD OF THE INVENTION

The invention relates generally to the compensation of crosstalk in communication system connectors. More particularly, the invention relates to compensation of crosstalk occurring in patch distribution modules.

BACKGROUND OF THE INVENTION

Telecommunications and data transmission systems more and more often are being called upon to operate at higher and higher frequencies with the huge increases in signaling traffic. Although present day cables and wiring theoretically can handle such increased frequencies, one of the problems encountered is an increase in crosstalk as frequency of transmission is increased. For example, at frequencies above one megahertz (1 MHz), the degradation of signals due to crosstalk can become unacceptable. The source of such crosstalk is the electromagnetic radiation from the conductor pairs in, for example, a transmission cable which induces unwanted signals in adjacent pairs. This crosstalk materially decreases signal-to-noise ratios and results in increased error rates in data transmission. Various arrangements have been used for reducing crosstalk in cables, such as shielding individual pairs, helically winding twisted pairs, or increasing the physical separation of one pair from another.

Crosstalk also occurs in the hardware used to connect the cable or cables. The design of hardware, and more particularly the connectors therefor, normally must include provisions for reducing crosstalk within the connectors themselves or for counteracting the crosstalk produced by such connectors. The plugs that commonly are used in telecommunications equipment generally include four pair connectors. In some instances, it is desirable to connect such plugs to 25 pair connectors. The conductors within both the plugs and 25 pair connectors necessarily are oriented both parallel and close together, a condition that leads to excessive crosstalk at high frequencies.

In an effort to satisfy the ANSI/EIA/TIA standards, many connectors have been designed with internal crosstalk compensation. In several of these connectors, it has been found that the crosstalk coupling induced by connector interface can be reduced to a great extent by routing the conductors of the connectors to a printed wiring board to produce a net reduction in undesired crosstalk. The circuit traces that form the pairs of conductors preferably are arranged in a pattern that produces crosstalk opposite in polarity to the pattern that produces the crosstalk. One such arrangement is disclosed in U.S. Pat. No. 5,700,167, issued to Pharney, et al. In this patent, a patch distribution module is disclosed that incorporates a plurality of connector jacks that each includes means for inducing crosstalk compensation. These connector jacks are mounted to an internal circuit board comprising a plurality of individual layers that provide an additional measure of crosstalk compensation to provide a net amount of compensation. Although providing for connection between modular plugs and individual wire conductors with acceptable signal-to-noise ratios, utilization of the patch distribution module disclosed in this patent is limited to the coupling of four pair plugs with such individual conductors. Therefore, this module cannot be used to couple such plugs to higher order connectors such as 25 pair connectors.

Although there are several connectors available that are capable of coupling standard modular plugs to 25 pair connectors, applicants know of no such connector which satisfies the stringent requirements of ANSI/EIA/TIA. In Category 5 of ANSI/EIA/TIA, it is required that a connector exhibit a pair-to-pair, nearend crosstalk ("NEXT") loss which does not exceed 40 dB at 100 MHz. Since 25 pair connectors are designed to carry six times the signals of ordinary four pair cable, this requirement must be met on an even more stringent power sum basis since, for each pair, crosstalk couplings from each of the other pairs must be compensated. The requirements for satisfying the crosstalk on a power sum basis are set forth in Category 5E of ANSI/EIA/TIA.

From the above, it can be appreciated that it would be advantageous to have an electrical connector, such as a patch distribution module, capable of electrically connecting modular plugs to 25 pair connectors, which complies with Category 5E of ANSI/EIA/TIA.

SUMMARY OF THE INVETION

The present invention relates to a communications connector having internal crosstalk compensation. The connector comprises an internal circuit board having a plurality of circuit board layers that include a plurality of capacitive and inductive devices that counteract the crosstalk created by a first other connector mated to the communications connector. The circuit board therefore comprises a first crosstalk compensation region. In addition, the communications connector comprises an internal fanout assembly mounted to the internal circuit board. The fanout assembly has a plurality of conductors arranged so as to form a compensation area that counteracts crosstalk created by a second other connector mated to the communications connector. The fanout assembly therefore comprises a second crosstalk compensation region.

In a most preferred arrangement, the communications connector comprises a patch distribution module for electrically coupling at least one modular plug to a multiple pair connector such as a 25 pair connector. In this arrangement, the connector further includes an outer housing composed of a dielectric material and at least one connector jack adapted to electrically connect to the at least one modular plug, an internal fanout assembly having a plurality of conductors arranged so as to form a compensation area that counteracts crosstalk created by the multiple pair connector.

The circuit board can comprise a crosstalk compensating circuit board having a plurality of circuit board layers including a component side and a wiring side, a plurality of capacitive devices provided on the circuit board layers, and at least one capacitive device provided on the outer surface of at least one of the component and wiring sides, the at least one capacitive device being arranged so as to produce a predetermined capacitance in conjunction with at least one of the plurality of capacitive devices provided on the circuit board layers, the at least one capacitive device further being manually reducible in size so as to adjust the amount of capacitance created therewith such that the amount of crosstalk compensation provided by the crosstalk compensation circuit board can be adjusted.

The objects, features, and advantages of this invention will become apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
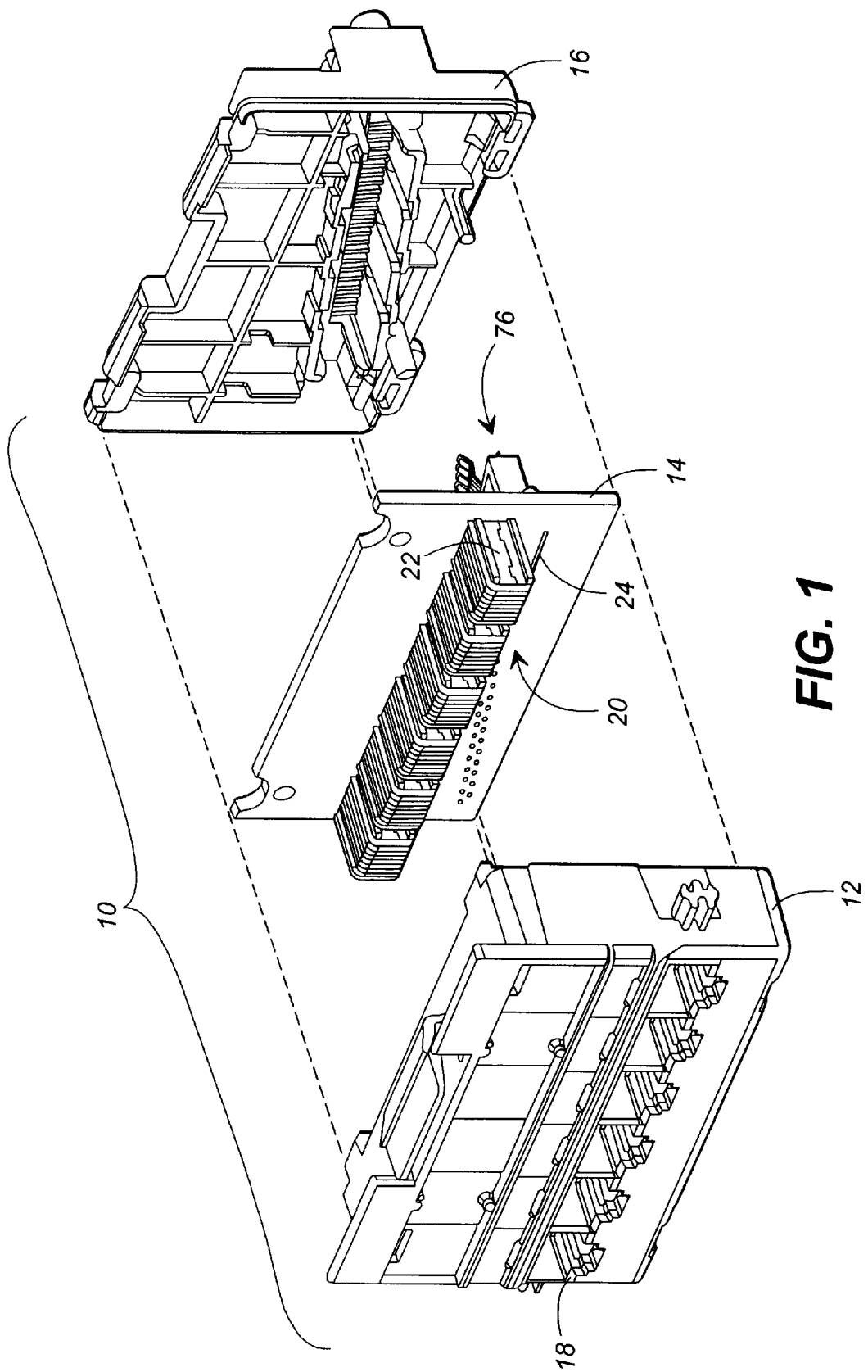
FIG. 1 is an exploded perspective view of an embodiment of a patch distribution module constructed in accordance with the present invention.
Figure 2:
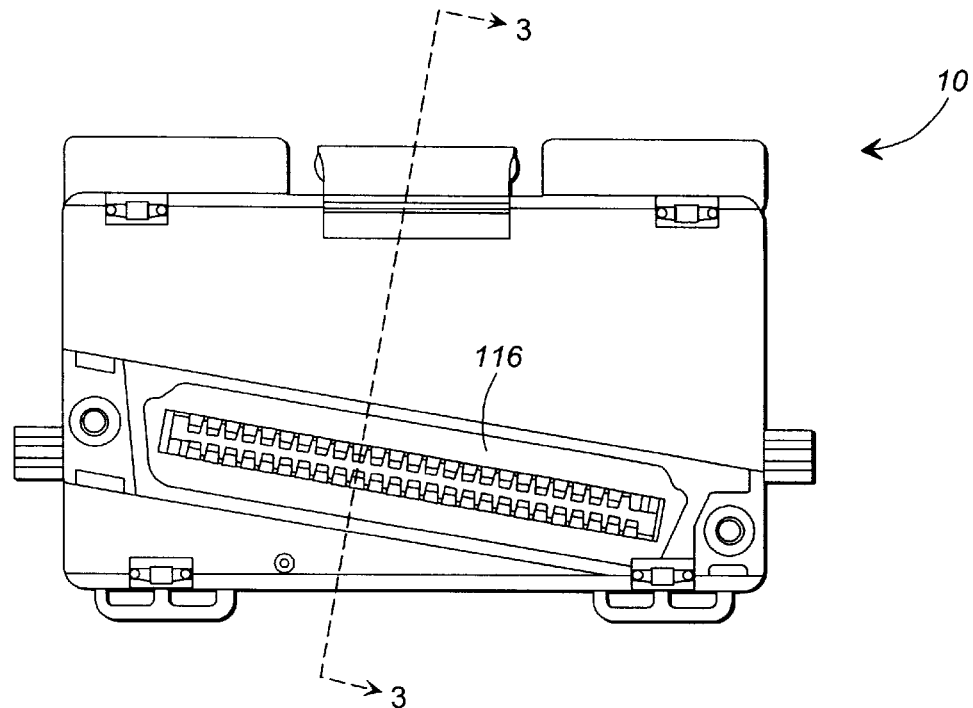
FIG. 2 is a rear view of the patch distribution module shown in FIG. 1.
Figure 3:
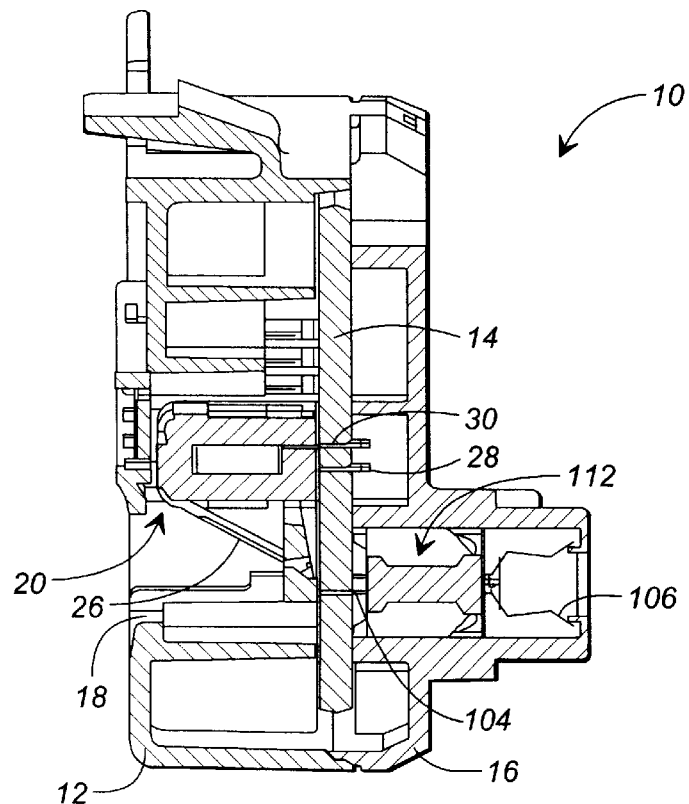
FIG. 3 is a cross-sectional view of the patch distribution panel shown in FIG. 2 taken along line 3—3.

Referring now in more detail to the drawings, in which like numerals indicate corresponding parts throughout the several views, FIGS. 1–3 illustrate an embodiment of a patch distribution module 10 constructed in accordance with the present invention. As indicated most clearly in the exploded view of FIG. 1, the patch distribution module 10 generally comprises a front housing 12, a crosstalk compensation circuit board 14, and a rear housing 16. The front housing 12 includes a plurality of plug apertures 18 that are adapted to receive standard modular plugs (not shown). The apertures 18 extend through the front housing 12 and are configured to receive, at the rear thereof a plurality of connector jacks 20 that are mounted to the circuit board 14. As is known in the art, both the front housing 12 and the rear housing 16 are constructed of a dielectric material such as plastic.

The connector jacks 20 mounted to the crosstalk compensation circuit board 14 typically are configured as spring blocks adapted to electrically connect to the conductor pairs of the modular plugs when these plugs are inserted into the plug apertures 18. Preferably, six such connector jacks 20 are provided, although it is to be understood that greater or fewer such connector jacks could be used, if desired. As indicated in FIG. 1, the connector jacks 20 typically comprise a dielectric block portion 22 and a plurality of conductors 24 that are disposed within and that extend outwardly from the block portion. As depicted in FIG. 3, each conductor 24 includes a first or contact portion 26 and a second or pin connector portion 28. The contact portions 26 typically extend downwardly from the dielectric block portion 22 at an angle thereto and the pin connector portions 28 typically extend outwardly from the rear of the block portion. Each connector jack 20 normally comprises four pairs of conductors 24 such that eight contact portions 26 and eight pin connector portions 28 protrude from the block portion 22. Configured in this manner, the contact portions 26 specifically are adapted to contact the conductor pairs of the modular jacks that plug into the front housing 12, and the pin connector portions 28 are arranged so as to be insertable into pin holes 30 provided in the circuit board 14 (FIG. 3). To facilitate mounting of the jacks 20 to the circuit board 14, each pin connector portion 28 preferably takes the form of a press-fit eyelet member designed to frictionally engage a circuit board pin hole 30.

Figure 4:
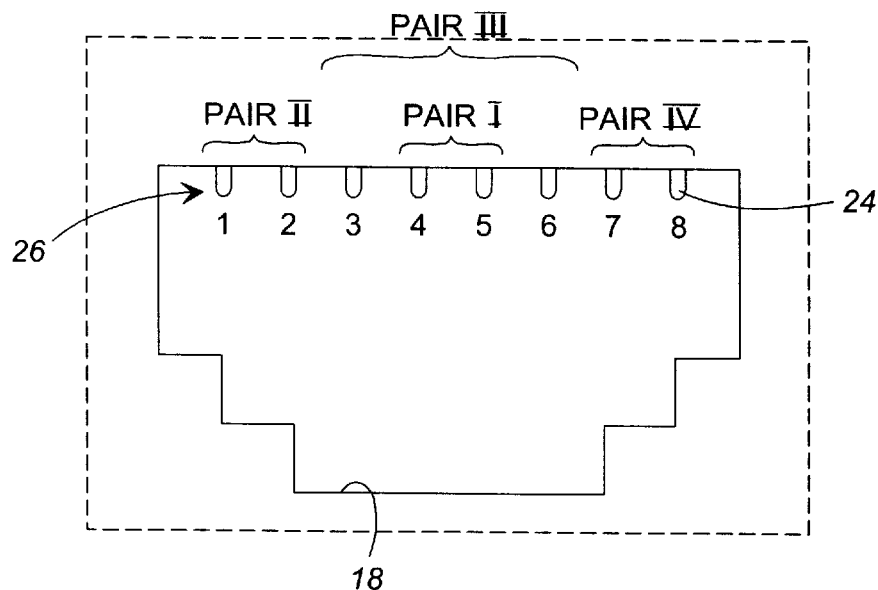
FIG. 4 is a diagrammatic representation of the conductor layout for the conductor jack shown in FIG. 1.

FIG. 4 illustrates the arrangement of the conductor pairs with a schematic of the contact portions 26 of one connector jack housed in its corresponding plug aperture 18. In this figure, the first through fourth pairs of the plugs are designated as pairs I, II, III, and IV. The tip conductor of pair II, occupies position 1 and the corresponding ring conductor occupies position 2. The tip conductor of pair I occupies position 5, and the corresponding ring conductor occupies position 4. The tip conductor of pair III occupies position 3 and the corresponding ring conductor occupies position 6. Finally, the tip conductor of pair IV occupies position 7 and the ring conductor thereof occupies position 8. As can be appreciated with reference to FIG. 4, pair II straddles pair I within the aforementioned arrangement. It is to be noted that, although these tip and ring positions are arranged according to convention and therefore are deemed preferable, alternative arrangements are feasible.

As is known in the art, the bulk of the crosstalk created by the modular plugs is produced by pairs I and III of the plugs. This phenomenon primarily is due to the straddling of pair I by pair III described above. To counteract the relatively large amount of negative crosstalk created between these two pairs, multistage compensation can be utilized to produce out-of-phase (ie., positive) crosstalk. For a full discussion of multistage compensation, reference U.S. patent application Ser. No. 09/109,125, filed Jun. 30, 1998, in the name of Adriaenssens, et al. In the presently disclosed embodiment, adequate crosstalk compensation is obtained with two-stage compensation that is provided by the circuit board 14. Accordingly, the circuit board 14 provides a first compensation region.

Figure 5:
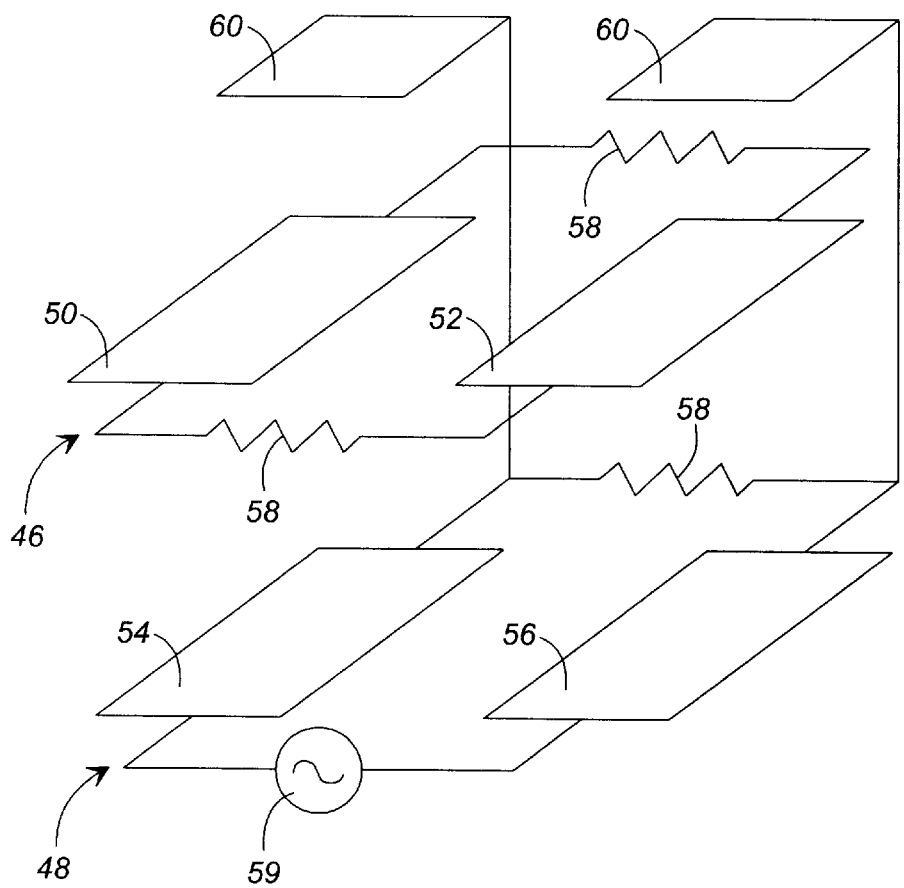
FIG. 5 is a diagrammatic representation of the circuit board shown in FIG. 1.

FIG. 5 provides a diagranmatic representation of a compensation circuit formed in the circuit board 14 when it is used to counteract crosstalk produced by pairs I and III. As indicated in this figure, the compensation circuit for each compensation stage comprises a first loop 46 and a second loop 48 that are both capacitively and inductively coupled to produce a signal opposite in polarity to the offending crosstalk. As depicted in the figure, each loop 46, 48 forms a capacitance, represented as capacitive devices such as capacitive plates 50–56, and an internal resistance, represented as resistors 58 in response to a voltage source 59 applied thereto. Electrically coupled to the first loop 46 are capacitive surface devices 60, also represented as capacitive plates, which therefore have the same polarity as the second loop 48. As is discussed below, these surface devices 60 facilitate tuning of the amount of compensating crosstalk created in each compensation stage.

In the first compensation stage, the capacitive devices 50 and 52 of the first loop 46 are positively and negatively charged, respectively, while the capacitive devices 54 and 56 of the second loop 48 similarly are positively and negative charged, respectively. With this configuration, the first stage of compensation produces a substantial amount of positive crosstalk that counteracts the negative crosstalk created by pairs I and III of the modular plug. In the second compensation stage, the capacitive devices 50 and 52 of the first loop 46 are positively and negatively charged, respectively, while the capacitive devices 54 and 56 of the second loop 48 are negatively and positively charged, respectively. With this configuration, the second stage of compensation produces an amount of negative crosstalk that balances the relatively large amount of positive crosstalk created by the first stage of compensation.

Figure 6:
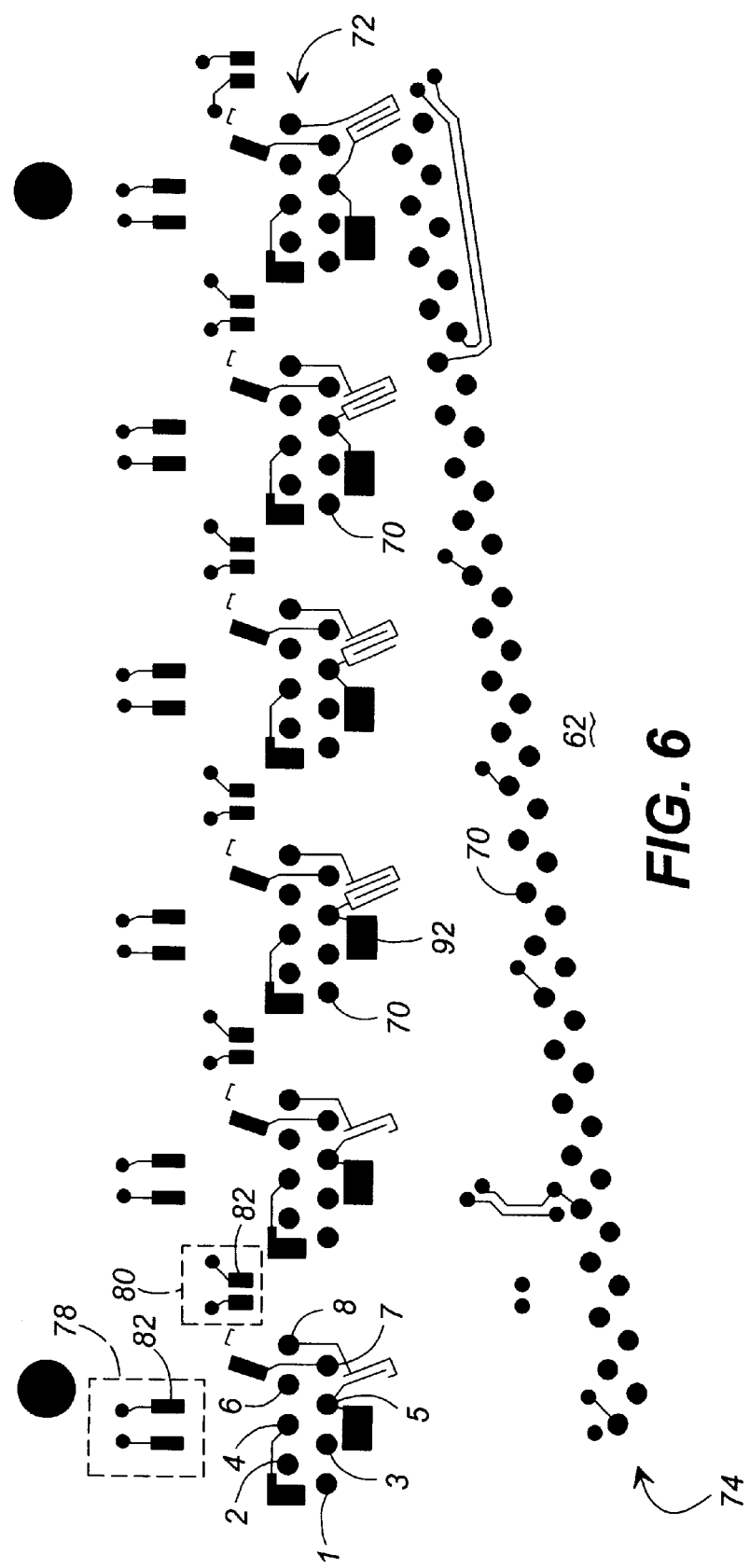
FIGS. 6–9 are diagrammatic representations of the conductor traces of the individual layers of the circuit board shown in FIG. 1.
Figure 7:
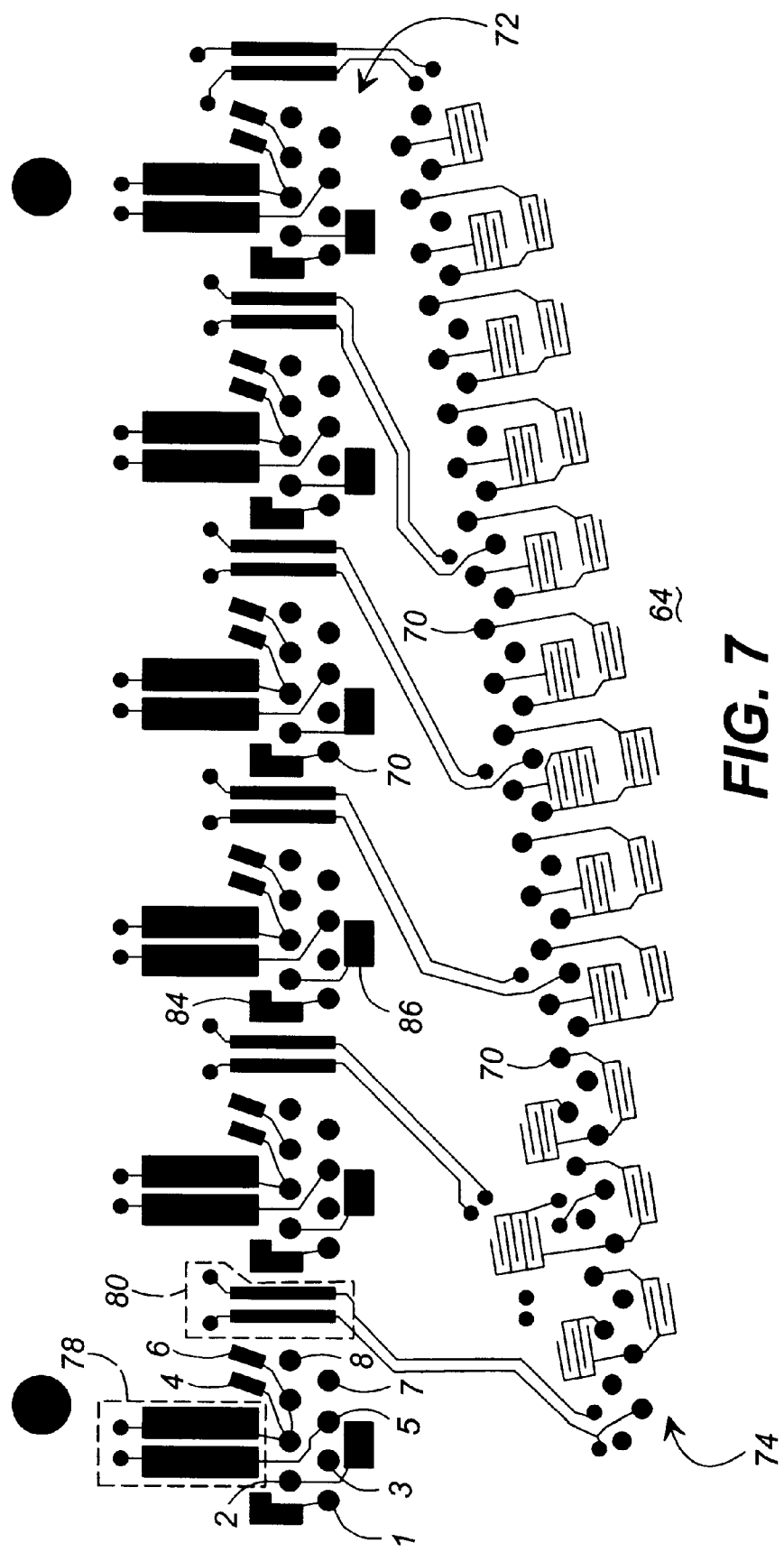
Figure 8:
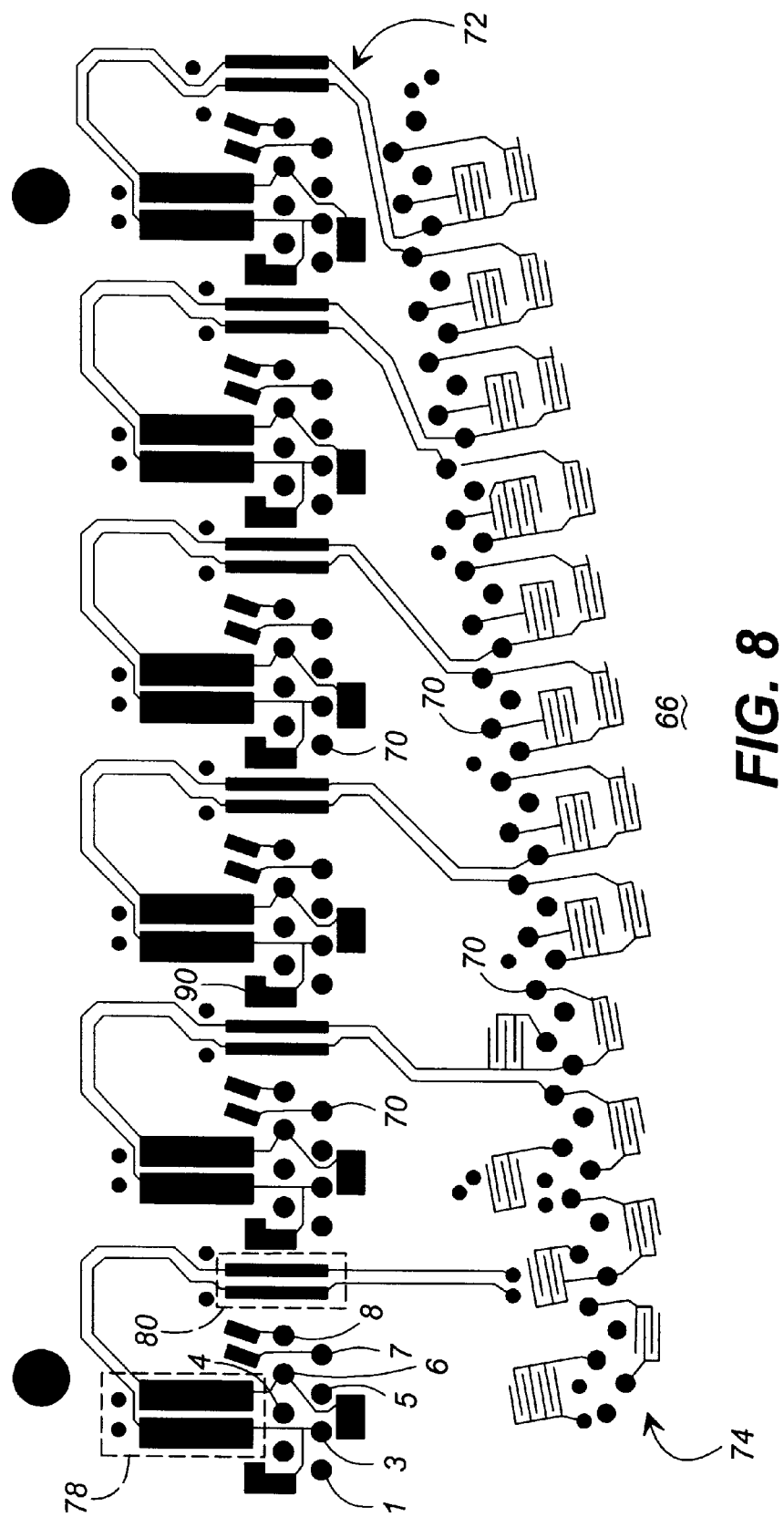
Figure 9:
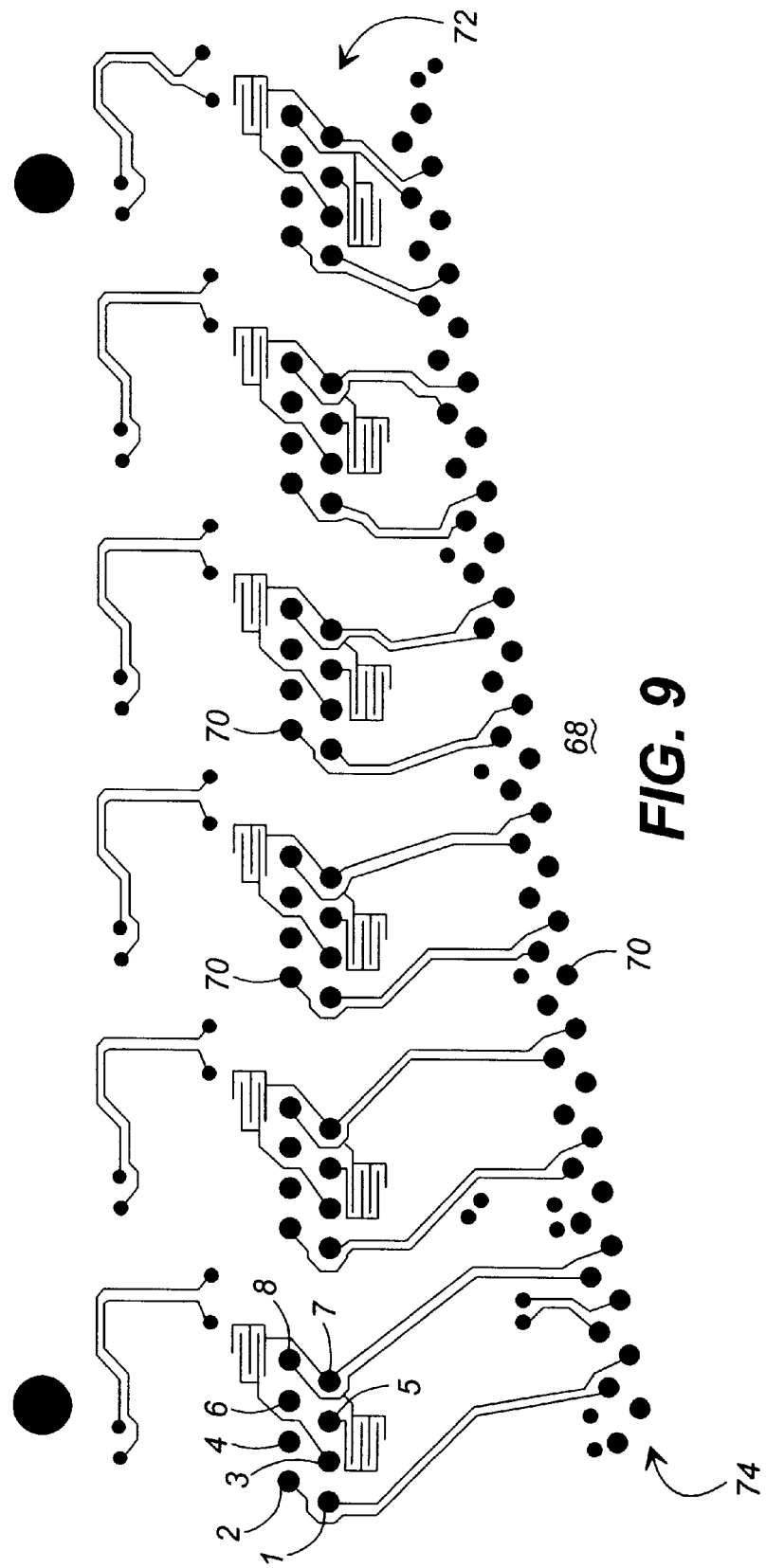

FIGS. 6–9 illustrate the first through fourth layers 62–68 the crosstalk compensation circuit board 14 of the disclosed embodiment. Each of these layers normally is constructed of a dielectric material such as epoxy glass. In FIG. 6 there is shown the first layer 62 of the circuit board 14. This first layer 62 forms the component side of the circuit board 14 which faces the front housing 12 of the patch distribution module 10. The fourth layer 68 shown in FIG. 13 forms the wiring side of the circuit board 14 which faces the rear housing 16 of the module 10. Arranged in this manner, the first and fourth layers 62 and 68 can be described as forming the front and rear sides of the circuit board 14.

As indicated in FIGS. 6–9, each circuit board layer is provided with a plurality of pin holes 70 that are adapted to receive the pins of a connector. As is conventional in the art, each pin hole 70 of each layer are arranged so as to align with one pin hole 70 of each of the other layers such that the pins holes form passages that extend through the circuit board 14 from the front to the rear sides of the board. Each of these passages is electrically connected such that each forms a through hole through which electrical signals can travel. The pin holes 70 are arranged in two main rows: a first or horizontal row 72 configured to receive the pin connector portions 28 of the connector jacks 20, and a second or diagonal row 74 configured to receive the pin connector portions of a fanout assembly 76 described hereinafter. The pin holes 70 of the horizontal row 72 are arranged in six groups of eight holes so as to cooperate with the pin connector portions 28 of six different connector jacks 20. Each of these pin holes 70 for receiving leads 1–8 of the left most connector jack (jack position 1) has been labeled as positions 1–8 for purposes of the following discussion. It will be understood that the other jack positions, although not explicitly described herein, are of similar construction and therefore operate in similar manner to jack position 1.

In keeping with the configuration shown in FIG. 5, pin hole position 1 corresponds to the tip conductor for pair II, pin hole position 2 corresponds to the ring conductor for pair II, pin hole position 3 corresponds to the tip conductor for pair III, pin hole position 4 corresponds to the tip conductor of pair I, pin hole position 5 corresponds to the ring conductor of pair I, pin hole position 6 corresponds to the ring conductor of pair III, pin hole position 7 corresponds to the tip conductor of pair IV, and pin hole position 8 corresponds to the ring conductor of pair IV. Further identified in FIGS. 6–9 are the two areas 78, 80 that correspond to the first and second stages of compensation, respectively, for each circuit board layer. Located inside each of these areas 78, 80 on the first layer 62 are the capacitive devices 82 that correspond to capacitive surface devices 60 shown in the diagrammatic representation of FIG. 5. These devices 82 typically comprise conductive plates formed on or otherwise attached to the surface of the circuit board 14.

In accordance with the description of the two-stage compensation of pairs I and III provided above, it can be seen that pin hole positions 3–6 electrically connect to various capacitive devices, such as capacitive plates and inductive devices, of the circuit board layers to provide positive capacitive and inductive compensating crosstalk to counter the negative crosstalk produced by pairs I and III of the plug. As can be appreciated from FIGS. 6–9, the crosstalk created by the coupling of the other plug conductor pairs also is compensated with the circuit board 14. By way of example, the negative crosstalk created between pairs II and III is compensated with positive crosstalk induced with capacitor plates 84 and 86, of the second layer 64 of the circuit board (see third jack position, FIG. 7), which are aligned with capacitor plates 90 and 92 of the third and first layers 66 and 62 of the circuit board (see third jack position, FIGS. 6 and 8). These capacitor plate pairs induce positive, capacitive compensation that counteract the negative crosstalk created by plug pairs II and III. As will be appreciated by those of skill in the art, the undesired crosstalk created between the other conductor pairs is compensated in similar manner by the various capacitive devices provided in the several layers of the circuit board. Although the particular arrangements of the electrical traces and capacitive devices shown in FIGS. 6–9 are presently preferred, it is to be appreciated that these arrangements are only exemplary in nature and by no means constitute the only configurations that provide the advantageous results described herein.

As is generally known in the art, the specific amount of crosstalk compensation required for a particular application will depend upon various operating parameters such as data transmission frequency and the specific geometry of the conducting, inter-connecting paths. In appreciation of this fact, the patch distribution module 10 further comprises simple means for tuning the amount of crosstalk compensation produced within the circuit board 14. Specifically, the size of the capacitive devices 82 positioned on the surface of the component side of the circuit board 14 can be altered to adjust the amount of capacitive compensation created in each compensation stage for each modular plug. To accomplish such tuning, the capacitive devices 82 can be physically trimmed, for example with a knife edge, while in place atop of the surface of the circuit board 14, to reduce the amount of capacitive and inductive compensation produced in the particular stage in which the device resides. Since the capacitive devices 82 can only be decreased in size in this manner, they typically are constructed such that an adequately large amount of compensation can be generated to suit most applications (e.g., data transmission frequencies of 1 MHz and lower). As can be appreciated from the above, the degree of trimming required for each respective application will depend upon the particular operating parameters. Where trimming is necessary or desirable, the degree to which each capacitive member 82 is to be trimmed either can be determined on a trial and error basis or through mathematical modeling.

Figure 10:
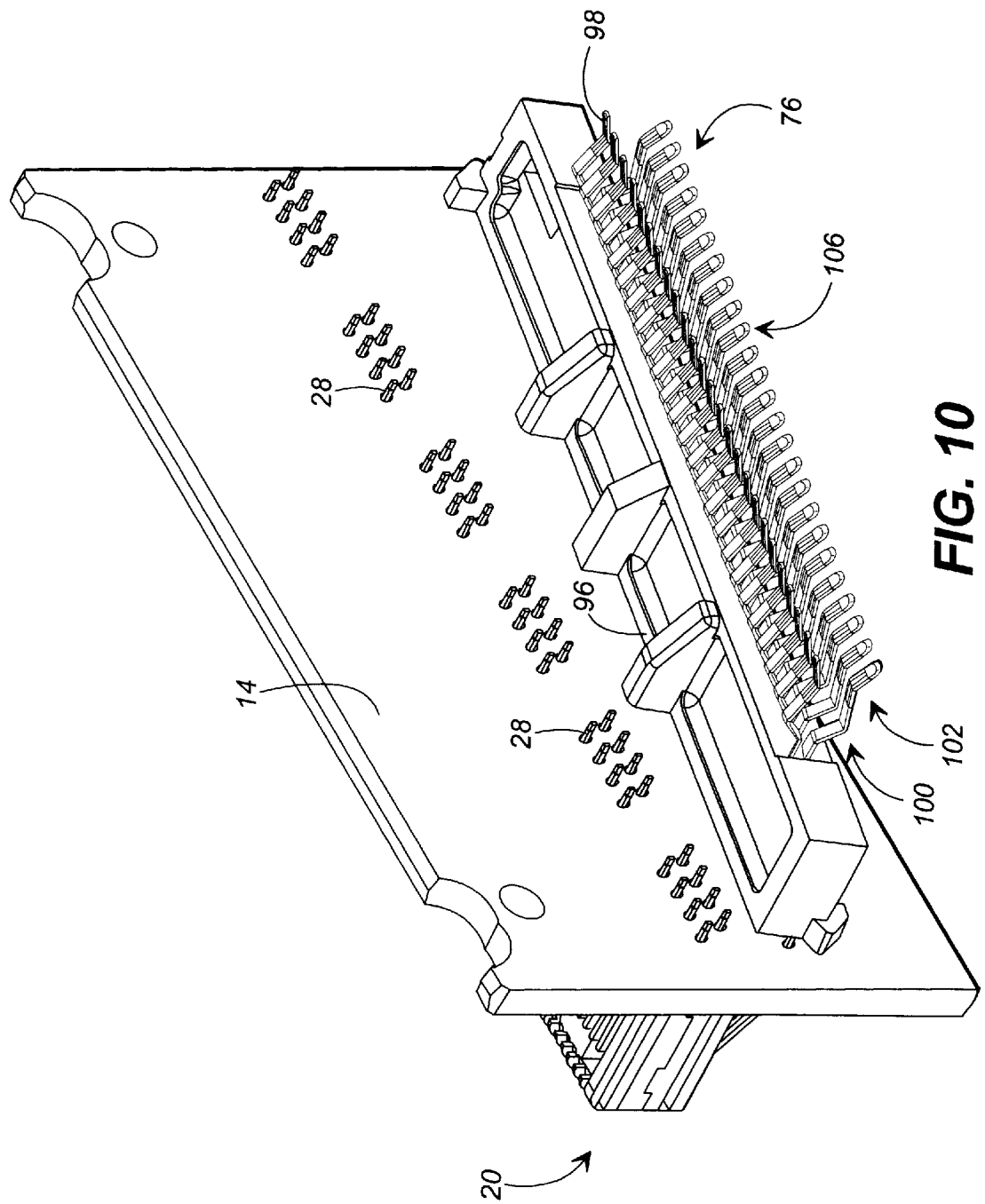
FIG. 10 is a perspective view of the circuit board shown in FIG. 1.

In addition to the connector jacks 20, a fanout assembly 76 is connected to the crosstalk compensation circuit board 14 as indicated in FIG. 10. The fanout assembly 76 is mounted to the rear side of the circuit board 14 and is electrically connected thereto via the aforementioned diagonal row 74 of pin holes 70. This fanout assembly 76 generally comprises a fanout housing 96 and a plurality of conductors 98 that extend through the housing. The fanout housing 96 is constructed of a dielectric material such as plastic and, in a preferred arrangement, is injection molded about its conductors 98 to form an integral assembly. The conductors 98 typically are arranged within the fanout housing 96 in two aligned rows 100, 102 that both extend outwardly from the front and rear sides of the housing. The number of conductors 98 in each row is the same, for example 25, such that the conductors are adapted to connect with a 25 pair connector (not shown).

Figure 11:
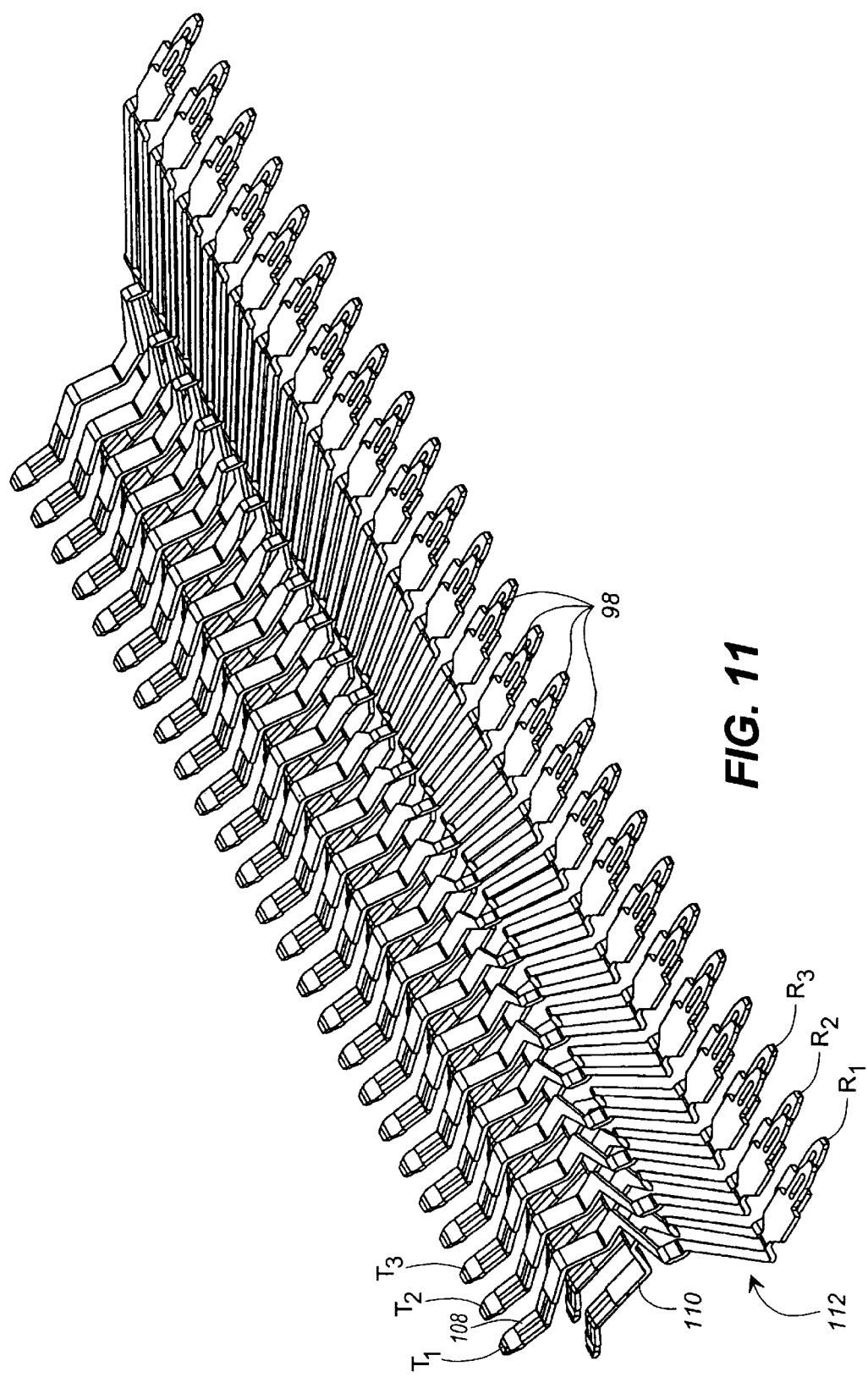
FIG. 11 is a spatial representation of the conductor array for the fanout assembly shown in FIG. 10.

Normally, the fanout conductors 98 are arranged as a plurality of conductor pairs, with each pair comprising a conductor from each row 100, 102. Each conductor 98 extends from the front side to the rear side of the fanout housing 96 and includes a first end portion 104 that extends into an associated pin hole 70 of the circuit board 14 (FIG. 3), and a second end portion 106 that extends from the rear side of the housing so as to form mating contacts adapted to electrically connect to the corresponding conductors of the 25 pair connector. FIG. 11 depicts the spatial orientation of the conductors 98 within the fanout assembly 94 with the left side in the figure corresponding to the left side of the circuit board layers shown in FIGS. 6–9. As indicated in this figure, each conductor pair includes a first conductor 108 and a second conductor 110 which, by the way of convention, comprise a tip (T) conductor and a ring (R) conductor, respectively, such that the conductors are arranged as separate rows of tip and ring conductors.

As explained above, 25 pair connectors create a relatively large amount of crosstalk that is to be compensated. To counteract for this crosstalk the fanout assembly 76 includes internal compensation, and therefore comprises a third region of crosstalk compensation. For purposes of discussion, the first three tip conductors in FIG. 11 are labeled T1–T3, while the first three ring conductors are labeled R1–R3. As shown in this figure, each tip and ring pair is positioned closely adjacent to one another within a compensation area 112. Specifically, each tip conductor 108 is positioned closely adjacent to the ring conductor 110 of the immediately adjacent tip and ring pair with this sequence repeating continually along the length of each row. For instance, the conductor labeled T2 is positioned immediately adjacent both the conductors R1 and R2 just as the conductor labeled T3 is positioned immediately adjacent both conductors R2 and R3. This fanout positioning creates both capacitive and inductive crosstalk that is out-of-phase of the near end crosstalk created by the twenty-five pair connector used with the patch distribution module 10. As is further indicated in FIG. 11, the compensation area 112 is arranged such that the portion of each conductor 98 that passes through the compensation area is contained within substantially the same plane. Furthermore, the conductors 98 are arranged such that their lateral spacing is decreased as the conductors extend away from the circuit board 14. In this manner, the conductors can be described as "fanning out" toward the circuit board 14. This fanout arrangement facilitates physical and electrical connection of the 25 pair connector to the circuit board 14.

As will be appreciated by persons having ordinary skill in the art, the most desirable dimensions and spacing of the conductors 98 within the fanout assembly 76 can be determined through known techniques. For example, as an extension from the equations in Walker, *Capacitance, Inductance and Crosstalk Analysis*, (Artech House 1990) at pages 32–34, 51–53, and 101–102, the mutual capacitance unbalance, $C_{u1}$, and the mutual inductance, $L_{m1}$, between two conductor pairs, can be determined according to the following equations $$C_{u1} = \frac{\pi \epsilon_r \epsilon_0 l \ln[1 + (h/d)^2]}{\ln\left[\frac{\pi d}{a+b}\right]\ln\left[\pi\frac{\sqrt{d^2+h^2}}{a+b}\right]}$$ Equation 1

$$L_{m1} = \frac{\mu_r \mu_0}{2\pi} l \ln\left(\frac{h^2+d^2}{d^2}\right)$$ Equation 2 where l is the length of the portion of each conductor 98 in the compensation area 112, $\epsilon_0$ is the dielectric constant of free space, $\epsilon_r$ is the relative dielectric constant of the intervening material (the polymeric material), h is the vertical separation between conductors in a pair, d is the horizontal separation between the conductors of the pairs, a is the width of the conductors, b is the thickness of the conductors, $\mu_0$ is the permeability of free space, and $\mu_r$ is the relative permeability of the intervening material.

It is known from *Transmission Systems for Communications,* fifth edition, written by Members of Technical Staff, Bell Telephone Laboratories (Bell Telephone Laboratories, Inc. 1982) pages 127–130, that if the transmission paths are short relative to the wavelength, and assuming equal source and load impedance, the nearend crosstalk $X_1$ induced on one pair by the other pair is then given by:

$$X_1 = \frac{Z_0}{2}\left[\frac{j\omega C_{u1}}{4} + \frac{j\omega L_{m1}}{Z_0^2}\right]$$ Equation 3 where $Z_0$ is the source or load impedance, assumed to be equal, and $\omega$ is the angular frequency of the applied signal.

The mutual capacitance unbalance, $C_{u2}$, and inductance, $L_{m2}$, between two pairs are given by:

$$C_{u2} = \epsilon_r \epsilon_0 H l_1 \left[\frac{1}{d^3} + \frac{1}{2d_2 + d_3} - \frac{2}{d_2 + d_3}\right]$$ Equation 4

$$L_{m2} = \frac{\mu_r \mu_0 L_1}{2\pi} \ln\left[\frac{(d_2+d_3)^2 + u^2}{\sqrt{[(2d_2+d_3)^2+u^2][d_3^2+u^2]}}\right]$$ Equation 5 where H is the overlap height between the conductors 98 of adjacent pairs, $l_1$ is the length of each conductor in the first compensation area 112, $d_2$ is the spacing between the conductors of adjacent pairs, and u is horizontal offset between pairs.

The canceling near-end crosstalk $X_2$ produced by the conductors 98 in the compensation region 104 is then:

$$X_2 = -\frac{Z_0}{2}\left[\frac{j\omega C_{u2}}{4} + \frac{j\omega L_{m2}}{Z_0^2}\right]$$ Equation 6 where the minus sign indicates that this crosstalk is 180° degrees out-of-phase with the crosstalk produced in the contacts mating section, due to the fact that the induced crosstalk (compensation) is into the opposite phase of the offended line.

In the embodiment shown in FIG. 11, each the portion of each conductor 98 in the compensation area 112 is approximately 6 mm–12 mm long, 0.5 mm wide, and 0.25 mm thick. As indicated in FIG. 11, the tip and ring conductors 108 and 110 preferably are contained within the same plane such that the vertical separation of the conductors is equal to zero and the overlap height is unity. In this embodiment, each conductor 98 is separated from the next by approximately 1.8 mm.

Like the connector jacks 20, the fanout assembly 76 provides a significant amount of crosstalk compensation. However, as with the modular plugs, additional crosstalk compensation may be necessary to comply with Category 5E of ANSI/FIA/TIA. Accordingly, the pin holes 70 of the diagonal row 74 of the circuit board layers normally can be electrically connected to additional capacitive devices 114 such as interdigitated fingers. The interdigitation of these fingers provides an additional measure of crosstalk compensation so that the crosstalk created by the 25 pair connector can be counteracted.

With reference to FIG. 2, the patch distribution module 10 is adapted to receive the 25 pair connector with the connector arranged in a diagonal or oblique orientation. To facilitate such connection, the rear housing 16 is provided with a diagonal or oblique connector interface 116. As will be appreciated by those of skill in the art, this diagonal or oblique configuration is especially advantageous when the 25 pair connector is configured as an end fed connector in that such a configuration reorients the connector cables so that they do not tend to interfere with the next 25 pair connector when a plurality of the patch distribution modules 10 are used together in a closely packed arrangement. Although simplifying the physical coupling of the 25 pair connectors, it is to be appreciated that the diagonal or oblique arrangement of the 25 pair connector relative to the patch distribution module 10 complicates the task of designing crosstalk compensation. Specifically, the asymmetry of the connection between the 25 pair connector and the circuit board 14 means that the crosstalk compensation provided by the individual layers of the circuit board normally also should be asymmetric. This further requires asymmetric construction of the individual circuit board layers. In FIG. 6, for example, it is readily apparent that the capacitive devices 82 of the first stage of the first circuit board layer 62 are noticeably larger adjacent the left side of the board as compared to those situated near the right. Accordingly, persons of skill in the art will understand that, if such diagonal or oblique connection between the 25 pair connector and the circuit board 14 is desired, the circuit board may need to be designed with conscious awareness of the asymmetry this coupling creates.

While preferred embodiments of the invention have been disclosed in detail in the foregoing description and drawings, it will be understood by those skilled in the art that variations and modifications thereof can be made without departing from the spirit and scope of the invention as set forth in the following claims.

What is claimed is:

1. A communications connector having internal crosstalk compensation, said connector comprising:
    an internal circuit board having a plurality of circuit board layers that include a plurality of capacitive and inductive devices that counteract the crosstalk created by a first other connector mated to said communications connector, said circuit board thereby comprising a first crosstalk compensation region; and
    an internal fanout assembly mounted to said internal circuit board, said fanout assembly having a plurality of conductors arranged so as to form a compensation area that counteracts crosstalk created by a second other connector mated to said communications connector, said fanout assembly thereby comprising a second crosstalk compensation region.

2. The connector of claim 1, wherein said fanout assembly includes a compensation region in which said conductors are arranged within substantially the same plane in close proximity to each other to produce the compensating crosstalk used to counteract the crosstalk created by the second other connector.

3. The connector of claim 1, wherein the first other connector is a modular plug having four pairs of conductors and said internal circuit board provides capacitive and inductive compensation to the first and third pairs of conductors to counteract the crosstalk created therebetween.

4. The connector of claim 3, wherein said capacitive and inductive compensation is produced by a two-stage compensation circuit.

5. The connector of claim 1, wherein said internal circuit board includes means for adjusting the amount of crosstalk compensation provided by said circuit board.

6. The connector of claim 5, wherein said means for adjusting the amount of crosstalk compensation provided by said internal circuit board comprises at least one trimmable capacitive plate mounted to an exterior surface of said circuit board.

7. The connector of claim 1, wherein said internal circuit board further includes a plurality of capacitive devices used to counteract the crosstalk created by the second other connector.

8. The connector of claim 7, wherein said plurality of capacitive devices comprises intertigitated conductor fingers electrically connected to the second other connector.

9. The connector of claim 1, wherein the second other connector is a 25 pair connector and said internal fanout assembly has 25 conductor pairs that are adapted to electrically connect to the 25 pair connector.

10. The connector of claim 9, wherein said internal fanout assembly is mounted in a diagonal orientation with respect to said internal circuit board such that the 25 pair connector connects to said communications connector in a diagonal orientation.

11. A patch distribution module for electrically coupling at least one modular plug to a multiple pair connector, said module comprising:
    an outer housing composed of a dielectric material;
    at least one connector jack adapted to electrically connect to the at least one modular plug;
    an internal fanout assembly having a plurality of conductors arranged so as to form a compensation area that counteracts crosstalk created by the multiple pair connector; and
    an internal circuit board electrically connected to both said at least one connector jack and said internal fanout assembly, said circuit board having a plurality of circuit board layers that include a plurality of capacitive and inductive devices that counteract the crosstalk created by the at least one modular plug.

12. The connector of claim 11, wherein the multiple pair connector is a 25 pair connector and said internal fanout assembly has 25 conductor pairs that are adapted to electrically connect to the 25 pair connector.

13. The connector of claim 11, wherein said internal fanout assembly includes a compensation region in which said conductors are arranged within substantially the same plane in close proximity to each other to produce the compensating crosstalk produced within said fanout assembly.

14. The module of claim 11, wherein said internal circuit board comprises a component side and a wiring side, said at least one connector jack being mounted to said circuit board on said component side and said internal fanout assembly being mounted to said circuit board on said wiring side.

15. The module of claim 14, wherein said internal fanout assembly is mounted to said internal circuit board in a diagonal orientation.

16. The module of claim 11, wherein the modular plug has four pairs of conductors and said internal circuit board provides capacitive and inductive compensation to the first and third pairs of conductors to counteract the crosstalk created therebetween.

17. The module of claim 16, wherein said capacitive and inductive compensation is produced by a two-stage compensation circuit.

18. The connector of claim 11, wherein said internal circuit board includes means for adjusting the amount of crosstalk compensation provided by said circuit board.

19. The connector of claim 18, wherein said means for adjusting the amount of crosstalk compensation provided by said internal circuit board comprises at least one trimmable capacitive plate mounted to an exterior surface of said circuit board.

20. The connector of claim 11, wherein said internal circuit board further includes a plurality of capacitive devices used to counteract the crosstalk created by the multiple pair connector.

21. The connector of claim 20, wherein said plurality of capacitive devices comprises interdigitated conductor fingers electrically connected to the multiple pair connector.

22. A crosstalk compensating circuit board, comprising:
   a plurality of circuit board layers including a component side and a wiring side, each of said component and wiring sides having an outer surface;
   a plurality of capacitive devices provided on said circuit board layers; and
   at least one capacitive device provided on said outer surface of at least one of said component and wiring sides, said at least one capacitive device being arranged so as to produce a predetermined capacitance in conjunction with at least one of said plurality of capacitive devices provided on said circuit board layers, said at least one capacitive device further being manually reducible in size so as to adjust the amount of capacitance created therewith such that the amount of crosstalk compensation provided by said crosstalk compensation circuit board can be adjusted.

23. The circuit board of claim 22, wherein said at least one capacitive device comprises a capacitive plate.

24. The circuit board of claim 23, wherein said capacitive plate is reducible by physically trimming said plate.

25. A method for adjusting the amount of crosstalk compensation produced by conductor pairs of a connector, said method including the steps of:
   electrically connecting the conductor pairs to a multi-layered circuit board having a component side outer surface and a wiring side outer surface;
   providing at least one of the layers of the circuit board with at least one capacitive device;
   providing at least one capacitive device on the outer surface of at least one of the component and wiring sides, the at least one capacitive device being arranged so as to produce a predetermined capacitance in conjunction with the at least one capacitive device provided on at least one of the circuit board layers when a signal is transmitted through the conductor pairs; and
   adjusting the size of the at least one capacitive device on the outer surface so as to adjust the amount of capacitance created within the circuit board such that the amount of crosstalk compensation provided to said conductor pairs.

26. The method of claim 25, wherein the at least one capacitive device on the outer surface comprises a capacitive plate.

27. The method of claim 26, wherein the step of adjusting the size of the capacitive plate is accomplished by physically trimming the plate.

* * * * *